| United States Patent [19] | [11] | 4,434,042 |
|---|---|---|
| Keith | [45] | Feb. 28, 1984 |

[54] PLANAR MAGNETRON SPUTTERING APPARATUS

[75] Inventor: Douglas L. Keith, Santa Clara, Calif.

[73] Assignee: The Board of Trustees of the Leland Stanford Junior University, Stanford, Calif.

[21] Appl. No.: 353,074

[22] Filed: Mar. 1, 1982

[51] Int. Cl.$^3$ ............................................. C23C 15/00
[52] U.S. Cl. .................................. 204/298; 204/192 R
[58] Field of Search ............................ 204/298, 192 R

[56] References Cited

U.S. PATENT DOCUMENTS

| 4,198,283 | 4/1980 | Class et al. | 204/298 |
|---|---|---|---|
| 4,265,729 | 5/1981 | Morrison | 204/192 R |
| 4,282,083 | 8/1981 | Kertesz et al. | 204/298 |

OTHER PUBLICATIONS

Thornton; J. Vac. Sci. Technol. 15 (1978), pp. 171–177.
Schiller et al., Thin Solid Films 64 (1979), pp. 455–467.

*Primary Examiner*—Arthur P. Demers
*Attorney, Agent, or Firm*—Flehr, Hohbach, Test, Albritton & Herbert

[57] ABSTRACT

A planar magnetron sputtering apparatus which minimizes contamination and controls the plasma for efficient power usage. The apparatus can be used in any orientation in most available vacuum systems. The power and coolant lines are at ambient pressure and are not exposed to the argon sputtering atmosphere. All seals in the apparatus are removed from the target area.

6 Claims, 3 Drawing Figures

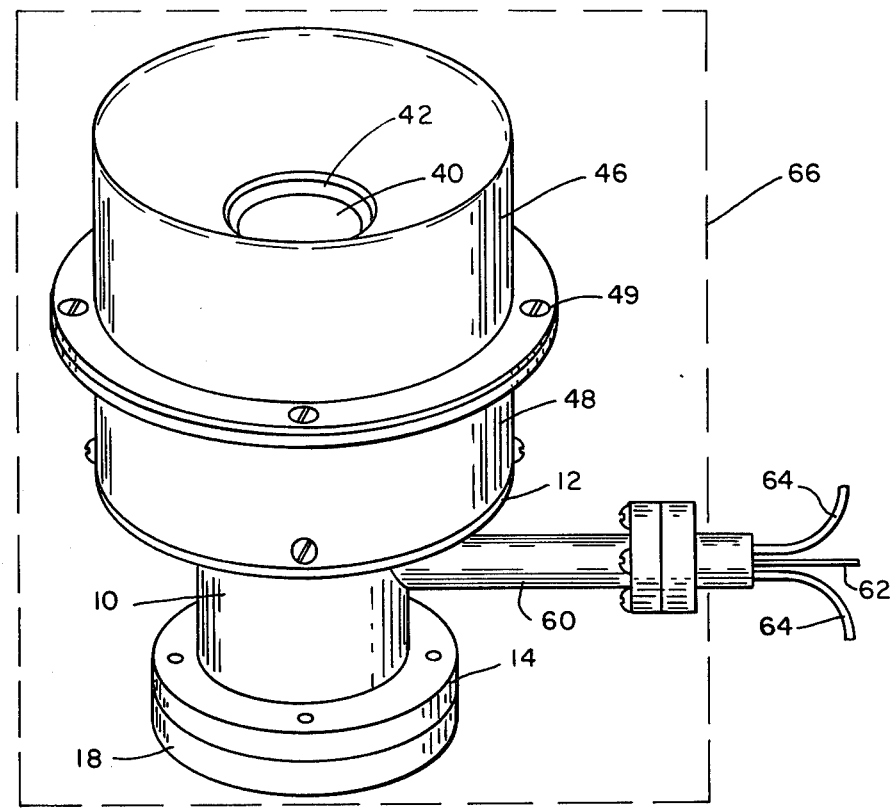
FIG.—1
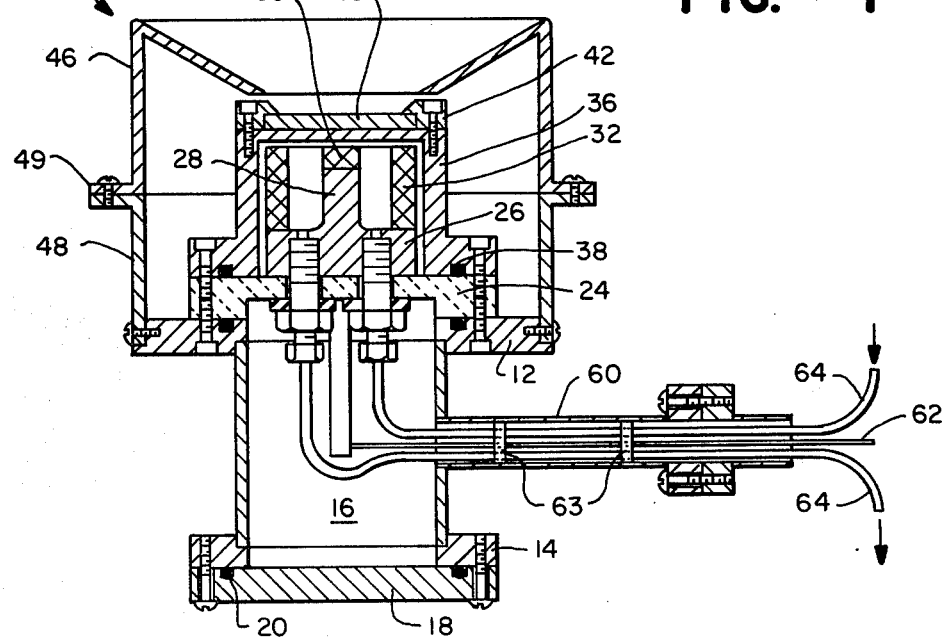
FIG.—2

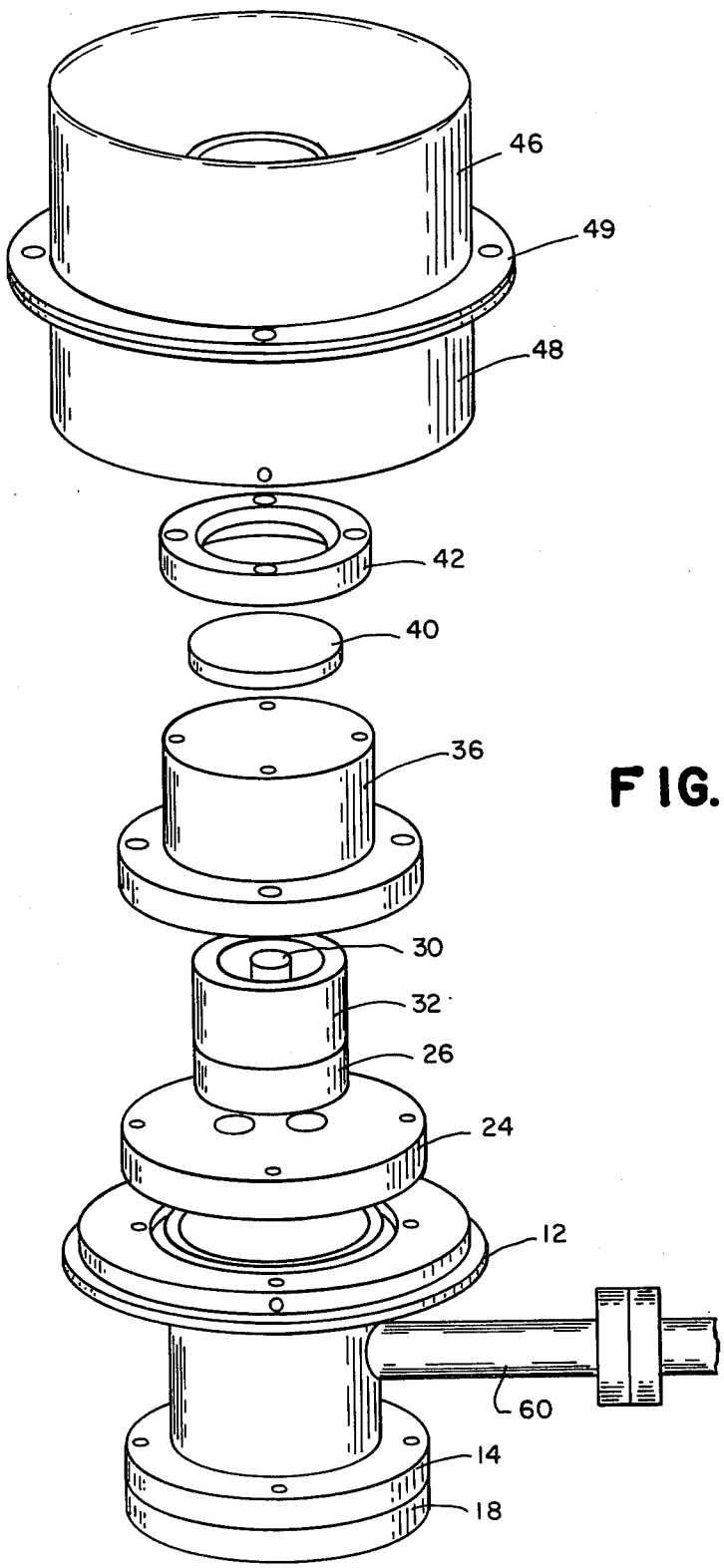
FIG.—3

PLANAR MAGNETRON SPUTTERING APPARATUS

The U.S. Government has rights in this invention pursuant to NSF Contract No. DMR-8020248.

This invention relates generally to sputtering apparatus, and more particularly the invention relates to a planar magnetron sputtering apparatus.

Ion plasma sputtering and ion beam sputtering are the two predominant procedures for ion sputtering. In ion plasma sputtering a gas discharge plasma is produced directly at the sputtering surface, and the ions produced in the plasma bombard a target which is at a large negative potential. The most widely used method for deposition of films, owing to its simplicity, is the ion plasma sputtering method. However, conventional ion plasma sputtering techniques are hindered by low rates of sputtering, high working voltages, intense temperatures, and radiation defects in the deposited film.

Attempts at eliminating these limitations of the ion plasma sputtering have led to the creation of better sputtering systems with high deposition velocities. The most important development has been the magnetron system for ion sputtering of material as discussed by Danillin and Sirchin in "Magnetron Systems for Ion Sputtering of Materials" Moscow Institute of Electronic Engineering, No. 4, pgs. 7–18, July-August, 1978 (translation copyrighted by Plenum Publishing Corporation 1979), and Chapin, "The Planar Magnetron A new High Rate Sputtering Source" Vacuum Technology Associates Inc. As discussed by Danalin and Sirchin, the magnetron ion sputtering system is similar to the microwave magnetron device in using crossed magnetic and electric fields. However, the magnetron ion sputtering device is a diode type sputtering system in which the atom of the sputtered material is removed from the surface of a target as it is bombarded with ions of the working gas, usually argon, produced in an anamolous glow discharge plasma. The principal elements of the system are a target cathode, an anode, and a magnetic system. A characteristic feature of the system is the presence of a magnetic field at the sputtered surface of the target which makes it possible to localize the plasma of the anamolous glow discharge directly at the target. When a dc voltage is applied between the target (negative potential) and the anode (positive or ground potential), an inhomogeneous electric field is produced and an anamolous glow discharge is developed. The electrons emitted from the cathode under the influence of the ion bombardment are captured by the magnetic field and remain as if in a trap produced by the magnetic field, which returns the electrons to the cathode, and by the target surface which repels the electrons. The electrons remain in this trap until several ionizing collisions take place with the atoms of the working gas as a result of which the electrons loose the energy acquired from the electric field. Before the electron falls on the cathode, the greater part of its energy is used for ionization and excitation of the gas thereby considerably increasing the activeness of the ionization process and leading to an increase of the concentration of the positive ions at the target surface. This in turn leads to an increase in the intensity of the ion bombardment of the target and to a considerable increase in the sputtering rate.

While the magnetron ion sputtering system offers a number of improvements over other ion plasma sputtering systems, the magnetron system has a number of shortcomings including uneven sputtering of the target, the requirement of water cooling of the target, contamination difficulties, and necessity for frequent cleaning of the source.

Accordingly, an object of the present invention is an improved magnetron sputtering apparatus.

Another object of the invention is a magnetron sputtering apparatus which can be readily operated in a number of positions.

Still another object of the invention is a magnetron sputtering apparatus which can be readily dismantled for cleaning or replacement of parts.

A further object of the invention is a magnetron sputtering system in which contamination is effectively controlled.

Still another object of the invention is a magnetron sputtering apparatus for producing sputtered films with an improved uniformity.

Briefly, in accordance with the invention a magnetic sputtering apparatus comprises a base having a top portion, a bottom portion, and an inner chamber. A support plate is positioned on the top portion of the base with the support plate having an outer insulative portion for engaging the base and an inner electrically conductive portion having a raised pedestal. A first magnet is mounted on the raised pedestal and a second annular magnet is mounted about the raised pedestal to establish a magnetic field.

A magnet housing is mounted on the outer insulative portion of the support plate and encapsulates the first and second magnet. The housing has a top surface in close proximity to the first and second magnets for supporting a target material.

Means is provided for applying a voltage to the inner conductive portion of the support plate, and means is provided for supplying a coolant to the inner electrical conductive portion of the support plate within the magnet housing.

A ground shield housing is positioned on the outer grounded portion of the base about the magnet housing and has a top surface with an opening for positioning above a target material on the top surface of the magnet housing.

In operation the electric and magnetic fields establish a plasma above the target surface (cathode) resulting in sputtering of the target material. The ground shield (anode) confines the sputtering from the target material whereby the sputtered material is directed through the opening only to an object to be coated with the sputtered material.

The invention and objects and features thereof will be more readily apparent from the following detailed description and appended claims when taken with the drawing, in which:

FIG. 1 is a perspective view of a magnetron sputtering apparatus in accordance with one embodiment of the invention.

FIG. 2 is a section view of the sputtering apparatus of FIG. 1.

FIG. 3 is an exploded perspective view of the sputtering apparatus of FIGS. 1 and 2.

Referring now to the drawings, in which like elements of the several views have the same reference numerals, the magnetron sputtering apparatus in accordance with one embodiment of the invention includes a base 10 having a top flange portion 12 and a bottom flange portion 14 and an inner chamber 16. A seal plate 18 is fastened to the bottom flange portion 14 with O ring 20 providing an airtight seal.

Mounted on the top flange portion 12 is a support plate having an outer insulative portion 24 and an inner conductive portion 26. A pedestal 28 extends from the inner conductive portion 26. A first magnet 30 is positioned on the pedestal 28 and a second annular magnet 32 is mounted about the raised pedestal. The magnets are made of high field cobalt-rare earth material.

A magnet housing 36 is mounted on the outer insulative portion 24 of the support plate and an O ring seal 38 encapsulates the magnets 30 and 32 therein. The magnet housing 36 has a top surface spaced from but in close proximity to the magnets 30 and 32, and a target material 40 is mounted on the top surface by means of a clamp 42.

A ground shield housing shown generally at 44 is supported on the top portion 12 of base 10 with the ground shield housing 44 including a top portion 46 and a mating bottom portion 48 which are fastened together by suitable means such as screws 49.

Tube 60 extends from the base 10, and an electrical conductor 62 passes through the tube 60 and the chamber 16 of the base to the inner conductor 26 of the support plate. Insulative spacers 63 support conductor 62 inside of tube 60. Coolant lines 64 extend through the tube 60, inner chamber 16, and the inner conductor 26 of the support plate to provide coolant to the magnets and the target 40 mounted on the top surface of the magnetic housing 42.

In operation, the sputtering apparatus is placed within a chamber 66 containing argon gas. A substrate (not shown) is mounted above the target 40 within the chamber. Electric and magnetic fields establish a plasma above the target 40 with sputtered material from the target being directed to the substrate 68 through the window in the ground shield housing 44. The ground shield anode controls the plasma so that contamination cannot occur from sputtering of either the anode or the clamp ring. Sputtered material not directed at the substrate is captured by the anode and does not drop off into the anode-cathode space which could short out the source. Importantly, all seals in the apparatus are removed from the active area, and the seals need not be disturbed in changing targets. By controlling the anode-cathode spacing no spurious plasma discharge is possible.

Since the target mounting surface is flat, good heat transfer is achieved by applying a thin layer of silicon-silver filled compound between the target and the mounting surface on the magnetic housing. Importantly, the sputtering apparatus operates satisfactorily in any horizontal or vertical orientation. The apparatus can be mounted in almost any available vacuum system where sputtering gas and pumping orifices are available without major modification of the chamber. The targets are easily changed and the heat generated by the ion bombardment is efficiently transferred to the source-water cooling system.

Proper coaxial shielding of the power lead is provided to operate the source in the rf mode. No part of the transmission line is subjected to the low pressure sputtering gas, and the transmission line and water lines are maintained at atmospheric pressure. In one embodiment, the metal portion 26 and pedestal 28 of the support plate are iron to provide a magnetic path, and all other metal components are stainless steel or aluminum.

The magnetron sputtering apparatus in accordance with the invention has proved to be reliable, versatile, and easily used in producing high quality thin and thick films of solid, non-magnetic elements which can be cast or rolled to produce the ion target. Two or more sources may be used simultaneously or sequentially to produce alloys or layers as required. Not only is contamination minimized but also the plasma is effectively controlled for the most efficient use of the applied power.

While the invention has been described with reference to a specific embodiment the description is illustrative of the invention and is not to be construed as limiting the invention. Various modifications and applications may occur to those skilled in the art without departing from the true spirit and scope of the invention as defined by the appended claims.

What is claimed is:

1. A magnetron sputtering apparatus comprising
   a base having a top portion, a bottom portion, and an inner chamber,
   a support plate including an outer insulative portion for engaging said top portion of said base and an inner electrically conductive portion, said inner electrically conductive portion having a raised pedestal,
   a first magnet mounted on said raised pedestal and a second, annular magnet mounted about said raised pedestal,
   a magnet housing mounted on said outer insulative portion and encapsulating said first and second magnets, said housing having a top surface in close proximity to said first and second magnets for supporting a target material,
   means for supplying a coolant to said inner electrical conductor portion of said support plate within said magnetic housing, and
   means for applying a voltage to said inner electrically conductive portion of said support plate.

2. The magnetron sputtering apparatus as defined by claim 1 and further including a ground shield housing for positioning on said base about said magnet housing and having a top surface with an opening for positioning above a target material on said top surface of said magnet housing.

3. The magnetron sputtering apparatus as defined by claim 1 or 2 wherein said magnet housing engages said insulative portion of said support plate in an airtight seal.

4. The magnetron sputtering apparatus as defined by claim 3 and further including a lower seal plate for engaging said bottom portion of said base and sealing said inner chamber.

5. The magnetron sputtering apparatus as defined by claim 4 and further including tube means extending from said base, a power line extending through said tube means and said inner chamber to said inner electrical conductor portion of said support plate, and coolant lines extending through said tube means, said inner chamber, and said inner electrically conductive portion to said magnet housing.

6. The magnetic sputtering apparatus as defined by claim 1 and further including tube means extending from said base, a power line extending through said tube means and said inner chamber to said inner electrical conductor portion of said support plate, and coolant lines extending through said tube means, said inner chamber, and said inner electrically conductive portion to said magnet housing.

* * * * *